US005693955A

United States Patent [19]
Goronkin et al.

[11] Patent Number: 5,693,955
[45] Date of Patent: Dec. 2, 1997

[54] TUNNEL TRANSISTOR

[75] Inventors: Herbert Goronkin; Saied N. Tehrani, both of Tempe, Ariz.

[73] Assignee: Motorola, Schaumburg, Ill.

[21] Appl. No.: 625,666

[22] Filed: Mar. 29, 1996

[51] Int. Cl.$^6$ ............... H01L 29/06; H01L 31/0328; H01L 31/0336; H01L 31/072; H01L 31/109
[52] U.S. Cl. ............... 257/25; 257/29; 257/14; 257/27
[58] Field of Search ............... 257/24, 25, 22, 257/14, 19, 27

[56] References Cited

U.S. PATENT DOCUMENTS

| | | | |
|---|---|---|---|
| 4,721,983 | 1/1988 | Frazier | 257/25 |
| 5,270,225 | 12/1993 | Goronkin et al. | 257/25 |
| 5,428,224 | 6/1995 | Hayashi et al. | 257/25 |
| 5,489,785 | 2/1996 | Tehrani et al. | 257/25 |

*Primary Examiner*—Robert S. Tupper
*Assistant Examiner*—Adriana Giordana
*Attorney, Agent, or Firm*—Eugene A. Parsons

[57] ABSTRACT

A tunnel transistor including source and drain and a silicon oxide tunneling layer overlying the source. A polysilicon quantum well layer positioned on the tunneling layer and in contact with the drain. The quantum well layer having a thickness which places the ground state above the Fermi level. A silicon oxide insulating layer positioned on the quantum well layer and a gate electrode positioned on the insulating layer overlying the quantum well layer and the source terminal. The tunneling layer being thin enough to allow tunneling between the source and the quantum well layer, and the insulating layer being thick enough to prevent tunneling therethrough.

19 Claims, 1 Drawing Sheet

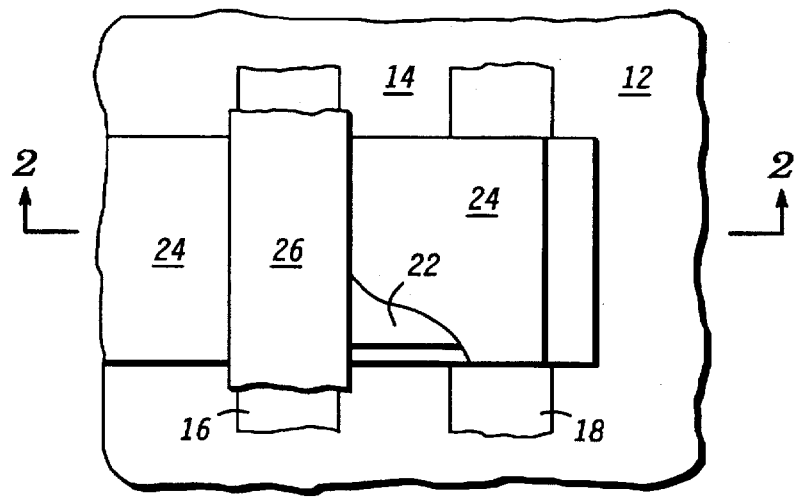
FIG. 1
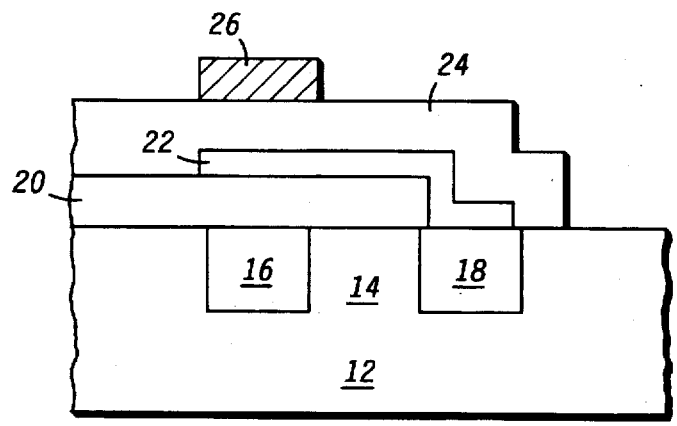
FIG. 2
FIG. 3
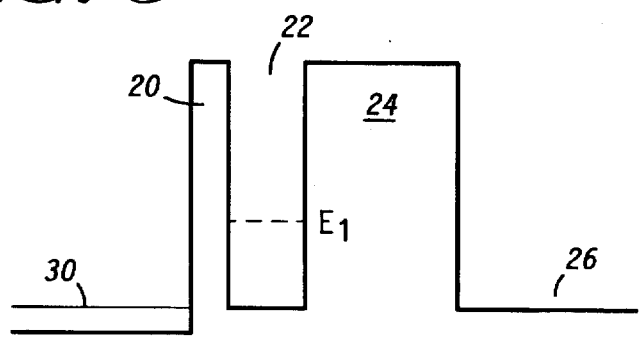

TUNNEL TRANSISTOR

FIELD OF THE INVENTION

The present invention pertains to transistors and more specifically to tunnel transistors.

BACKGROUND OF THE INVENTION

Common lateral transistors are formed in substrates with spaced apart electrodes and a channel area defined therebetween. Generally, the length of the channel area determines the operating frequency of the transistor, with shorter lengths producing higher frequency of operation. However, lower limits on the length of the channel and, therefor, upper limits on the operating frequency are determined by characteristics such as reverse voltage breakdown and the like.

It has been known for some time that various semiconductor materials can be formed in very thin layers so that energy levels within the material are limited to discrete energy levels. By depositing several very thin layers of different material in overlying relationship, devices, such as light emitting or sensing diodes can be formed. An example of such structures is disclosed in U.S. Pat. No. 5,079,601, entitled "Optoelectronic Devices Based on Intraband Transitions in Combinations of Type I and Type II Tunnel Junctions", issued Jan. 7, 1992.

In some instances, attempts have been made to form several very thin layers of different semiconductor material into three terminal devices, or transistors. One such attempt is disclosed in an article by N. Yokoyama et al., entitled "Resonant-Tunneling Hot Electron Transistor", Solid-State Electronics, vol/31, No., pp. 577–582, 1988, printed in Great Britain. In the disclosed device, layers of material are formed in vertical overlying relationship to produce a collector on the bottom, an emitter on the top and a base positioned therebetween similar to the well known vertical semiconductor transistor manufactured throughout the world. Because of the vertical positioning, base, emitter and collector connections and terminals are difficult to provide. While there are some differences in operation and while this hot electron transistor is vertically very thin, there is very little improvement in manufacturing difficulty and very little saving in chip real estate.

Accordingly it would be advantageous to provide a transistor which can be fabricated with a very thin channel area and good operating characteristics.

It is an object of the present invention to provide a new and improved tunnel transistor.

It is an another object of the present invention to provide a new and improved tunnel transistor which can be scaled to quantum dimensions.

It is yet another object of the present invention to provide a new and improved tunnel transistor in which the performance improved with reduction in size.

It is an still another object of the present invention to provide a new and improved tunnel transistor in which there are substantially no short channel effects

SUMMARY OF THE INVENTION

The above problems and others are at least partially solved and the above objects and others are realized in a tunnel transistor including a substrate structure having an area with a first conductivity and first and second spaced apart regions having a second conductivity and positioned in the area. A tunneling layer overlies the first region and a quantum well layer overlies the tunneling layer and is in contact with the second region. A control electrode overlies the quantum well layer and the tunneling layer. The quantum well layer has a thickness which places the ground state above the Fermi level and the tunneling layer is thin enough to allow tunneling between the source and the quantum well layer with the insulating layer being thick enough to prevent tunneling therethrough.

BRIEF DESCRIPTION OF THE DRAWINGS

Referring to the drawings:

FIG. 1 is a view in top plan of a tunnel transistor in accordance with the present invention;

FIG. 2 is a sectional view as seen from the line 2—2 of FIG. 1; and

FIG. 3 is an energy band diagram of the tunnel transistor of FIG. 1.

DESCRIPTION OF THE PREFERRED EMBODIMENT

Turning now to the drawings in which like reference characters indicate corresponding elements throughout the several views, attention is first directed to FIGS. 1 and 2 which illustrate a tunneling transistor generally designated by the reference character 10. Tunneling transistor 10 includes a substrate structure 12 having an area 14 with a first conductivity, and spaced apart regions 16 and 18 having a second conductivity and positioned in area 14. In this embodiment area 14 is doped with p dopant to form a p+ type conductivity and regions 16 and 18 are doped with a n dopant to form a n+ type conductivity. Regions 16 and 18 are formed by standard technology such as diffusion or implantation, etc.

A tunneling layer 20 is positioned on substrate structure 12 and overlying region 16. A quantum well layer 22 is positioned on tunneling layer 20, overlying region 16 and extend onto substrate structure 12 in contact with region 18. A control electrode insulating layer 24 is positioned on quantum well layer 22 in overlying relationship to region 16. It should be noted that insulating layer 24 can be extended to cover all of quantum well layer 22 and can operate to provide some passivation of the tunneling transistor 10 if desired. A control electrode 26 is positioned on insulating layer 24 in overlying relation with quantum well layer 22 and region 16.

In this specific example tunnel transistor 10 is a field effect transistor with region 16 being the source, region 18 being the drain and control electrode 26 being the gate. In this embodiment substrate structure 12 includes only a supporting substrate with regions 16 and 18 formed directly therein. However, one skilled in the art will understand that substrate structure 12 can includes additional layers (e.g. epitaxial layers) for convenience in fabricating the structure. Referring specifically to FIG. 1, source region 16 and drain region 18 extend laterally beyond the layers deposited on substrate structure 12 to permit metallization for the formation of external contacts (not shown). Also, control electrode 26 is formed with gate metal to provide an external gate electrode.

In this preferred embodiment, a silicon material system is employed, with the supporting substrate (substrate structure 12) being silicon, tunneling layer 20 being silicon dioxide ($SiO_2$), quantum well layer 22 being polysilicon and insulating layer 24 being silicon dioxide ($SiO_2$). Quantum well layer 22 must be formed with a vertical thickness small enough to have a ground state ($E_1$) above the Fermi level in a range of approximately 100–200 meV. Generally, the thickness of polysilicon will be in a range of approximately 3–5 nm. Tunneling layer 20 is thin enough to allow good carrier transmission or tunneling therethrough. When silicon dioxide is used, tunneling layer 20 is approximately 1.5–2 nm thick. Further, insulating layer 24 is thicker than tunneling layer 20, to retard carrier transmission or tunneling therethrough. When silicon dioxide is used, insulating layer 24 is in a range of approximately 3–5 nm thick.

Referring now to FIG. 3, a zero bias energy band diagram of tunnel transistor 10 is illustrated. The energy level of region 16 is illustrated at the left, also illustrating a Fermi level 30, with tunneling layer 20 illustrated adjacent thereto. Quantum well layer 22 is illustrated adjacent to tunneling layer 20 and shows the ground state $E_1$. Here it should be note that ground state $E_1$ is above Fermi level 30 in this zero bias condition. Also insulating layer 24 forms a large barrier to the transmission of electrons to gate 26.

In operation, when the correct potential is applied across the source and drain and a bias voltage is applied to the gate, the right side of the energy band diagram is shifted downward until the ground state $E_1$ is equal to or below Fermi level 30. At this time, carriers are free to tunnel through tunnel layer 20 from region 16 (source) to quantum well layer 22. Once the carriers reach quantum well layer 22, they flow laterally to region 18 (drain).

Accordingly a new and improved tunnel transistor has been disclosed which can be scaled to quantum dimensions. Also, the performance of the new and improved tunnel transistor improves with reduction in size of the channel between source and drain. This transistor is not dependent upon the length of the channel, therefore, there are substantially no short channel effects.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A tunnel transistor comprising:
   substrate structure having an area with a first conductivity and first and second spaced apart regions having a second conductivity and positioned in the area;
   a tunneling layer positioned overlying the first region;
   a quantum well layer overlying the tunneling layer and in contact with the second region; and
   a control electrode overlying the quantum well layer and the tunneling layer.

2. A tunnel transistor as claimed in claim 1 further including a control electrode insulating layer positioned between the quantum well layer and the control electrode.

3. A tunnel transistor as claimed in claim 2 wherein the quantum well layer has a thickness in a range of 3–5 nm.

4. A tunnel transistor as claimed in claim 2 wherein the control electrode insulating layer has a thickness in a range of 3–5 nm.

5. A tunnel transistor as claimed in claim 2 wherein the tunneling layer has a thickness in a range of approximately 1.5–2 nm.

6. A tunnel transistor as claimed in claim 1 wherein the tunnel transistor is a field effect transistor and the first and second spaced apart regions include a source and drain respectively and the control electrode is a gate.

7. A tunnel transistor as claimed in claim 6 wherein the quantum well layer has a ground state and a Fermi level, and the thickness of the quantum well layer places the ground state 100–200 meV above the Fermi level.

8. A tunnel transistor as claimed in claim 6 wherein the substrate is formed of silicon.

9. A tunnel transistor as claimed in claim 8 wherein the tunneling layer is formed of $Si_xGe_{1-x}$.

10. A tunnel transistor as claimed in claim 8 wherein the tunneling layer is formed of silicon oxide.

11. A tunnel transistor as claimed in claim 10 wherein the quantum well layer is formed of polysilicon.

12. A tunnel transistor as claimed in claim 11 further including a control electrode insulating layer formed of silicon oxide and positioned between the quantum well layer and the control electrode.

13. A tunnel transistor comprising:
   first and second spaced apart current carrying terminals;
   a tunneling layer positioned on the first current carrying terminal;
   a quantum well layer positioned on the tunneling layer and in contact with the second current carrying terminal, the quantum well layer having a ground state and a Fermi level, and a thickness which places the ground state 100–200 meV above the Fermi level;
   an insulating layer positioned on the quantum well layer; and
   a control electrode positioned on the insulating layer overlying the quantum well layer and the tunneling layer.

14. A tunnel transistor as claimed in claim 13 wherein the quantum well layer has a thickness in a range of 3–5 nm.

15. A tunnel transistor as claimed in claim 14 wherein the insulating layer has a thickness in a range of 3–5 nm.

16. A tunnel transistor as claimed in claim 15 wherein the tunneling layer has a thickness in a range of approximately 1.5–2 nm.

17. A tunnel transistor as claimed in claim 13 wherein the tunnel transistor is a field effect transistor and the first and second current carrying electrodes include a source and drain respectively and the control electrode is a gate.

18. A tunnel transistor as claimed in claim 17 wherein the substrate is formed of silicon, the tunneling layer is formed of silicon oxide, the quantum well layer is formed of polysilicon, and the insulating layer is formed of silicon oxide.

19. A tunnel transistor comprising:
   a silicon substrate structure having an area with a first conductivity and source and drain terminals having a second conductivity spaced apart in the area;
   a silicon oxide tunneling layer positioned on the silicon substrate structure overlying the source terminal, and having a first thickness allowing tunneling;
   a polysilicon quantum well layer positioned on the tunneling layer overlying the source terminal and in contact with the drain terminal, the quantum well layer having a ground state and a Fermi level, and a thickness which places the ground state above the Fermi level;
   a silicon oxide insulating layer positioned on the quantum well layer, and having a second thickness thicker than the first thickness to prevent tunneling; and
   a gate electrode positioned on the insulating layer overlying the quantum well layer and the source terminal.

\* \* \* \* \*